United States Patent
Lee

(10) Patent No.: US 8,871,638 B2
(45) Date of Patent: Oct. 28, 2014

(54) SEMICONDUCTOR DEVICE AND METHOD FOR FABRICATING THE SAME

(71) Applicant: SK hynix Inc., Gyeonggi-do (KR)

(72) Inventor: Nam-Jae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 44 days.

(21) Appl. No.: 13/716,962

(22) Filed: Dec. 17, 2012

(65) Prior Publication Data
US 2014/0035147 A1    Feb. 6, 2014

(30) Foreign Application Priority Data
Aug. 2, 2012  (KR) .......................... 10-2012-0084761

(51) Int. Cl.
| | |
|---|---|
| H01L 21/4763 | (2006.01) |
| H01L 23/48 | (2006.01) |
| H01L 23/52 | (2006.01) |
| H01L 29/40 | (2006.01) |
| H01L 23/532 | (2006.01) |
| H01L 21/768 | (2006.01) |
| H01L 23/522 | (2006.01) |
| H01L 27/108 | (2006.01) |

(52) U.S. Cl.
CPC .... H01L 21/76877 (2013.01); H01L 23/53238 (2013.01); H01L 21/7682 (2013.01); H01L 27/10888 (2013.01); H01L 23/5226 (2013.01); H01L 21/76838 (2013.01); H01L 27/10885 (2013.01); H01L 23/53295 (2013.01)
USPC ..................... 438/637; 257/762; 257/E23.141

(58) Field of Classification Search
CPC ..................... H01L 21/76877; H01L 23/5226
USPC ........................ 257/762, E23.141; 438/637
See application file for complete search history.

(56) References Cited

U.S. PATENT DOCUMENTS
2013/0323930 A1* 12/2013 Chattopadhyay et al. .... 438/703

FOREIGN PATENT DOCUMENTS
| KR | 1020040057348 | 7/2004 |
|---|---|---|
| KR | 101076811 | 10/2011 |

* cited by examiner

Primary Examiner — David S Blum
(74) Attorney, Agent, or Firm — IP & T Group LLP

(57) ABSTRACT

A method for fabricating a semiconductor device includes forming a first interlayer dielectric layer having a conductive contact, forming a sacrifice layer having a conductive interconnection over the first interlayer dielectric layer such that the conductive interconnection is contacted with the conductive contact, removing the sacrifice layer, and forming a recess by removing a part of the conductive contact exposed by the conductive interconnection.

20 Claims, 3 Drawing Sheets

SEMICONDUCTOR DEVICE AND METHOD
FOR FABRICATING THE SAME

CROSS-REFERENCE TO RELATED
APPLICATIONS

The present application claims priority of Korean Patent Application No. 10-2012-0084761, filed on Aug. 2, 2012, which is incorporated herein by reference in its entirety.

BACKGROUND

1. Field

Exemplary embodiments of the present invention relate to a semiconductor device and a method for fabricating the same, and more particularly, to a semiconductor device including conductive interconnections formed through a damascene process and a method for fabricating the same.

2. Description of the Related Art

A semiconductor device includes various interconnections formed in a plurality of layers and contacts for connecting interconnections in different layers. For example, a bit line is connected to a specific part under a bit line contact through a bit line contact disposed thereunder. FIG. 1 briefly illustrates the semiconductor device.

FIG. 1 is a cross-sectional view of a conventional semiconductor device.

Referring to FIG. 1, a first interlayer dielectric layer 11 includes a plurality of bit line contacts 12 provided therein. The plurality of bit line contacts 12 may be arranged at even intervals.

Over the first interlayer dielectric layer 11 having the plurality of bit line contacts 12 provided therein, a second interlayer dielectric layer 13 is disposed. The second interlayer dielectric layer 13 includes a plurality of bit lines 14 provided therein. Each bit line 14 is arranged to contact with a corresponding bit line contact 12, respectively.

The bit line 14 may be formed of copper (Cu) to reduce resistance. In this case, because Cu is not dry-etched, the bit line 14 is inevitably formed through a damascene process of burying a conductive material in a space where an insulating layer is etched.

Recently, with the increase in integration degree of semiconductor devices, the pitch of interconnections has been reduced. However, when the pitch of interconnections formed in a plurality of layers is reduced, an alignment margin between the bit line 14 and the corresponding bit line contact 12 decreases. Accordingly, a distance (as referred to symbol A) between a bit line contact 12 and another bit line 14 adjacent to the corresponding bit line 14 decreases. In this case, a bridge may occur between the bit line contact 12 and the adjacent bit line 14.

SUMMARY

Exemplary embodiments of the present invention are directed to a semiconductor device and a method for fabricating the same, which is capable of preventing a defect occurring during a conductive interconnection formation process using a damascene process and improving the characteristic of the semiconductor device.

In accordance with an exemplary embodiment of the present invention, a method for fabricating a semiconductor device includes: forming a first interlayer dielectric layer having a conductive contact; forming a sacrifice layer having a conductive interconnection over the first interlayer dielectric layer so that the conductive interconnection is contacted with the conductive contact; removing the sacrifice layer; and forming a recess by removing a part of the conductive contact exposed by the conductive interconnection.

In accordance with another exemplary embodiment of the present invention, a method for fabricating a semiconductor device includes: forming a first interlayer dielectric layer having a conductive contact that may be dry-etched; forming a sacrifice layer over the first interlayer dielectric layer; selectively etching the sacrifice layer to form a trench exposing the conductive contact; forming a conductive interconnection by burying a conductive material that may not be dry-etched, in the trench; removing the sacrifice layer; and forming a recess by dry-etching a part of the conductive contact exposed after the removing of the sacrifice layer.

In accordance with still another exemplary embodiment of the present invention, a semiconductor device includes: a first interlayer dielectric layer having a conductive contact; and a conductive interconnection formed over the first interlayer dielectric layer and contacted with the conductive contact, wherein the conductive interconnection includes a material that may not be dry-etched, and wherein the conductive contact is formed of a material that may be dry-etched and the conductive contact has a recess formed at a portion thereof, exposed by the conductive interconnection.

DETAILED DESCRIPTION

Figure 1:
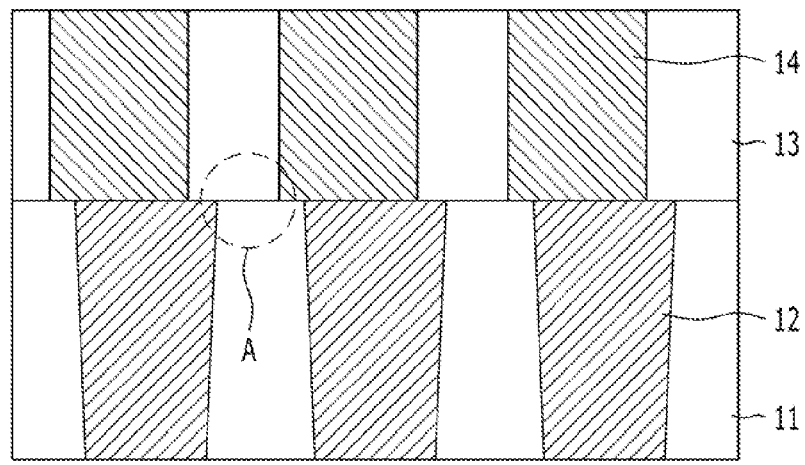
FIG. 1 is a cross-sectional view of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
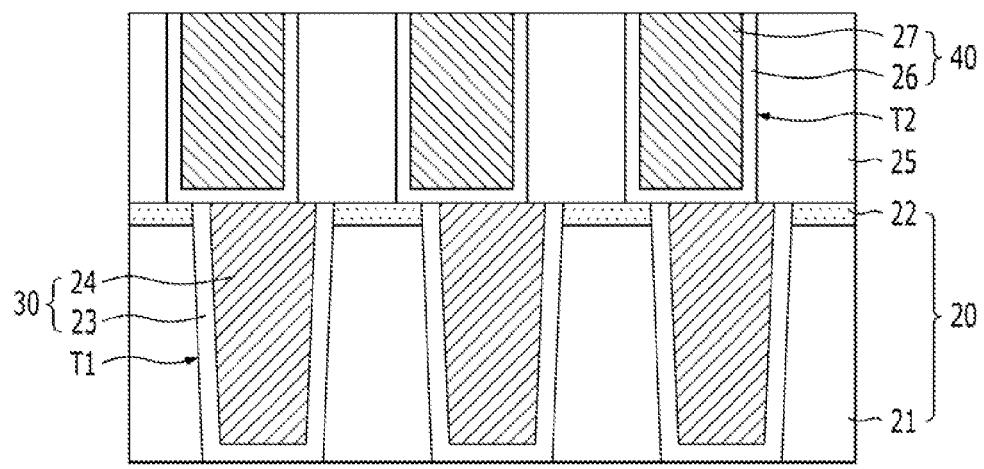
FIGS. 2 to 5 are cross-sectional view illustrating a semiconductor device and a method for fabricating the same in accordance with an embodiment of the present invention.
Figure 3:
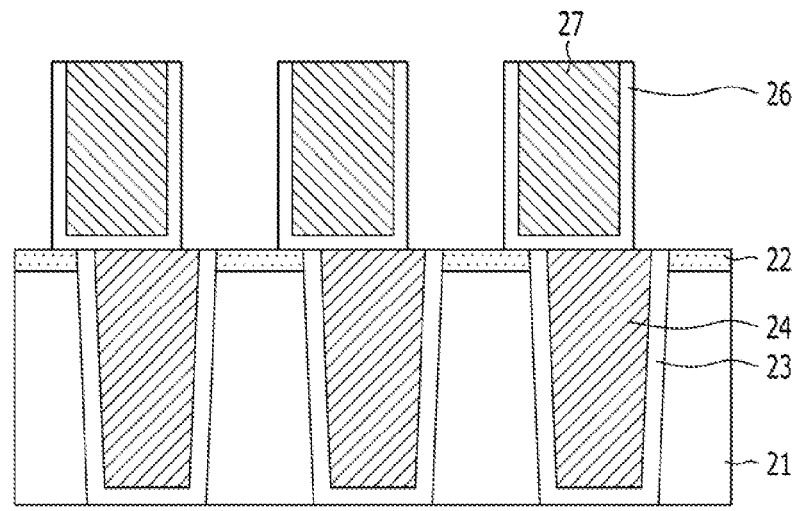
Figure 4:
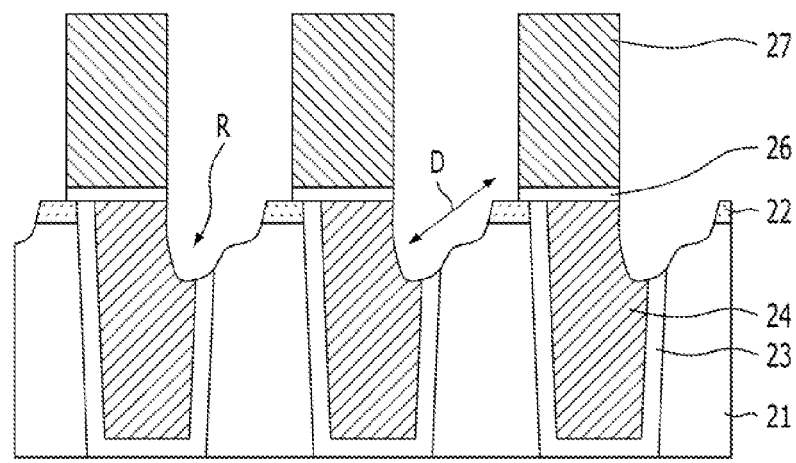
Figure 5:
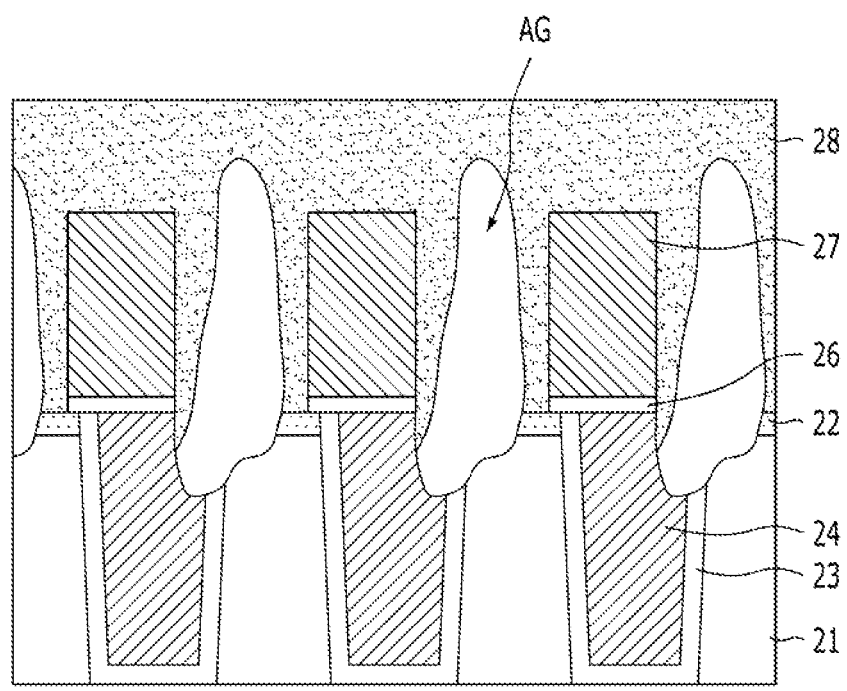

FIGS. 2 to 5 are cross-sectional view illustrating a semiconductor device and a method for fabricating the same in accordance with an embodiment of the present invention. FIG. 5 illustrates the semiconductor device, and FIGS. 2 to 4 illustrate intermediate steps for fabricating the semiconductor device of FIG. 5.

First, the fabricating method will be described.

Referring to FIG. 2, a first interlayer dielectric layer 20 having a conductive contact 30 provided therein is formed over a substrate (not illustrated) having a required lower structure.

The first interlayer dielectric layer 20 may have a double-layer structure in which a first insulating layer 21 and a second insulating layer 22 are sequentially stacked. The first insulating layer 21 may be formed of oxide, and the second insulating layer 22 may be formed of a material having a different etch rate from a sacrifice layer 25 to be described below, for example, nitride.

The conductive contact 30 may include a first barrier layer 23 and a first metal layer 24. The first barrier layer 23 is formed along the sidewalls and bottom surface of a first trench T1 that is formed in the first interlayer dielectric layer 20. The first metal layer 24 is buried in the first trench T1 having the first barrier layer 23 formed therein. The first metal layer 24 may be formed of a metal that may be dry-etched, for example, tungsten. The first barrier layer 23 serves to prevent diffusion of the first metal layer 24, and may be formed of, for example, tantalum and/or tantalum nitride.

The conductive contact 30 comprising a first barrier layer 23 and a first metal layer 24, and the first interlayer dielectric layer 20 including a first insulating layer 21 and a second insulating layer 22, may be formed by the following process. First, the first interlayer dielectric layer 20 is deposited on the substrate, and then selectively etched to form the first trench T1 for a conductive contact. Subsequently, the first barrier layer 23 is deposited along the entire surface of the resulting structure including the first trench T1. The first metal layer 24 is then formed over the first barrier layer 23 to such a thickness as to fill the first trench T1. A planarization process, for example, a chemical mechanical polishing (CMP) process is then performed until the second insulating layer 22 is exposed.

A sacrifice layer 25 having a conductive interconnection 40 provided therein is formed over the first interlayer dielectric layer 20 having the conductive contact 30 provided therein.

The conductive interconnection 40 is formed to contact the corresponding conductive contact 30. However, when a misalignment occurs between the conductive interconnection 40 and the conductive contact 30 or when there is a difference in plan area and/or shape between the conductive interconnection 40 and the conductive contact 30 even though no misalignment occurs, the conductive contact 30 is not completely covered by the conductive interconnection 40, but partially exposed.

The sacrifice layer 25 may be formed of, for example, oxide. Furthermore, the conductive interconnection 40 may include a second barrier layer 26 and a second metal layer 27. The second barrier layer 26 is formed along the sidewalls and bottom surface of a second trench T2 formed in the sacrifice layer 25, and the second metal layer 27 is buried in the second trench T2 having the second barrier layer 26 formed therein. The second metal layer 27 may be formed of a metal having low resistance, for example, Cu. The second barrier layer 26 serves to prevent diffusion of the second metal layer 27, and may be formed of, for example, tantalum and/or tantalum nitride. The second metal layer 27 may not be etched by dry etching.

The conductive interconnection 40 comprising a second barrier layer 26 and a second metal layer 27, and the sacrifice layer 25, may be formed by the following process. That is, the sacrifice layer 25 is deposited on the first interlayer dielectric layer 20 having the conductive contact 30 provided therein, and then selectively etched to form the second trench T2 exposing the corresponding conductive contact 30. Then, the second barrier layer 26 is deposited along the entire surface of the resultant structure including the second trench T2, and the second metal layer 27 is formed over the second barrier layer 26 to such a thickness as to fill the second trench T2. Then, a planarization process, for example, CMP is performed until the sacrifice layer 25 is exposed.

The conductive contact 30 and the conductive interconnection 40 may serve as a bit line and a bit line contact, respectively, but the present invention is not limited thereto.

Referring to FIG. 3, the sacrifice layer 25 is removed.

The removal of the sacrifice layer 25 may be performed through a wet dip-out process. In this process, since the second insulating layer 22 is formed of a material having a different etch rate from the sacrifice layer 25, only the sacrifice layer 25 may be easily removed without damage of the second insulating layer 22 and the first insulating layer 21 thereunder.

Referring to FIG. 4, the part of the conductive contact 30, exposed after the removal of the sacrifice layer 25, is removed to form a recess R. As described above, the conductive contact 30 is not completely covered by the conductive interconnection 40. Therefore, when the sacrifice layer 25 is removed, the surface of the conductive contact 30 is partially exposed. The partially exposed part of the conductive contact 30 may be etched to form a recess R.

The removal of the conductive contact 30 may be performed by a dry etching process. When the first and second barrier layers 23 and 26 are formed of the same material, the second barrier layer 26 of the conductive interconnection 30 may be removed together while the first barrier layer 23 of the conductive contact 30 is removed. As a result, the part of the second barrier layer 26, positioned on the sidewalls of the second metal layer 27, may be removed. Even at this time, the part of the second barrier layer 26, positioned under the second metal layer 27, remains due to the characteristic of the dry etching process. Furthermore, when the second metal layer 27 is formed of a metal that may not be dry etched, for example, Cu, the second metal layer 27 is not damaged even though the first barrier layer 23 and the first metal layer 24 are etched.

During the removal process for the conductive contact 30, the second insulating layer 22 and the first insulating layer 21, either alone or together, may be removed. In this exemplary embodiment of the present invention, a part of the second insulating layer 22 is removed, and the other part of the second insulating layer 22 is left. However, the present invention is not limited thereto. In another exemplary embodiment, the entire part of the second insulating layer 22 may be removed during this process.

As such, when a part of the conductive contact 30 is removed to form the recess R, the following effect may be obtained.

First, since a distance (as referred to symbol D) between the conductive contact 30 and another conductive interconnection 40 adjacent to the corresponding conductive interconnection 40 increases, a bridge may be prevented from occurring between the conductive contact 30 and the adjacent conductive interconnection 40.

Furthermore, since the part of the second barrier layer 26, positioned on the sidewalls of the second metal layer 27, is removed, the plan area of the recess R may be further increased by the thickness of the second barrier layer 26. Accordingly, a bridge may be further prevented from occurring. Furthermore, since the second barrier layer 26 having high resistance is removed, the resistance of the metal interconnection 40 may be further reduced. On the other hand, since the part of the second barrier layer 26, positioned under the second metal layer 27, remains, the second barrier layer 26 is still positioned between the second metal layer 27 and the first metal layer 24, thereby preventing metal diffusion between the second metal layer 27 and the first metal layer 24.

Furthermore, since the second metal layer 27 is not dry-etched, the second metal layer 27 is not damaged even though the first barrier layer 23 and the first metal layer 24 are etched. Accordingly, the second metal layer 27 may sufficiently serve as an interconnection.

Furthermore, when the entire part of the second insulating layer 22 formed of nitride having a high permittivity is removed, nitride may be removed between the conductive interconnections 40. Therefore, the interference between the conductive interconnections 40 may be reduced.

Referring to FIG. 5, a second interlayer dielectric layer 28 is formed over the resulting structure of FIG. 4. The second interlayer dielectric layer 28 may be formed of, for example, nitride.

Here, as the second interlayer dielectric layer 28 is formed by plasma enhanced chemical vapor deposition (PECVD) such that the step coverage characteristic thereof is degraded, an air gap AG may be formed between the conductive interconnections 40. When the air gap AG is formed between the conductive interconnections 40, the permittivity between the conductive interconnections 40 decreases to reduce coupling capacitance. The bottom surface of the air gap AG may be positioned under the conductive interconnections 40 along the recess R.

In accordance with the above-described fabrication method, it is possible to prevent a bridge from occurring between the conductive contact 30 and the adjacent conductive interconnection 40. Furthermore, it is possible to reduce the interference or coupling capacitance between the conductive interconnections 40. Therefore, the characteristic of the semiconductor device is improved. In particular, the air gap AG for reducing the coupling capacitance may be formed only by depositing the second interlayer dielectric layer 28 without a separate process, because the sacrifice layer 25 is already removed to form the recess R during the previous process (refer to FIG. 4). In other words, the processes of FIGS. 2 to 4 may be easily combined with the process of forming the air gap AG.

The semiconductor device of FIG. 5 may be fabricated by the above-described fabrication method.

Referring to FIG. 5, the semiconductor device in accordance with the embodiment of the present invention includes the first interlayer dielectric layer 20 having the conductive contact 30 and the conductive interconnection 40 formed over the first interlayer dielectric layer 20 and contacted with the conductive contact 30.

Here, the conductive contact 30 exposed by the conductive interconnection 40 has a recess area formed therein. Accordingly, a part of the conductive contact 30 exposed by the conductive interconnection 40 has a surface positioned at a lower level than the other part thereof.

The second interlayer dielectric layer 28 is disposed over the conductive interconnection 40, and may provide an air gap between the conductive interconnections 40. Since the air gap AG is positioned over the area where the recess R is formed, the bottom surface of the air gap AG may be positioned under the conductive interconnection 40.

In accordance with the embodiments of the present invention, it is possible to prevent a defect occurring during the process of forming the conductive pattern contacted with the conductive contact, and improve the characteristic of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first interlayer dielectric layer having a conductive contact;
    forming a sacrifice layer having a conductive interconnection over the first interlayer dielectric layer such that the conductive interconnection is contacted with the conductive contact;
    removing the sacrifice layer; and
    forming a recess by removing a part of the conductive contact exposed by the conductive interconnection.

2. The method of claim 1, further comprising forming a second interlayer dielectric layer over the resulting structure, the second interlayer dielectric layer providing an air gap between the conductive interconnections, after the forming of the recess.

3. The method of claim 1, wherein the first interlayer dielectric layer comprises first and second insulating layers which are sequentially stacked, and the second insulating layer has a different etch rate from the sacrifice layer.

4. The method of claim 1, wherein the forming of the sacrifice layer having the conductive interconnection comprises:
    forming the sacrifice layer over the first interlayer dielectric layer having the conductive contact;
    selectively etching the sacrifice layer to form a trench exposing the conductive contact; and
    forming the conductive interconnection to fill the trench.

5. The method of claim 4, wherein the forming of the conductive interconnection comprises:
    forming a second barrier layer along the sidewalls and bottom surface of the trench; and
    forming a second metal layer to fill the trench having the second barrier layer formed therein.

6. The method of claim 5, wherein the conductive contact comprises a first metal layer and a first barrier layer surrounding the sidewalls and bottom surface of the first metal layer, and
    in the forming of the recess,
    the second barrier layer disposed on the sidewalls of the second metal layer is removed.

7. The method of claim 3, wherein, in the forming of the recess,
    the second insulating layer is removed.

8. The method of claim 2, wherein the bottom surface of the air gap is positioned under the conductive interconnection.

9. A method for fabricating a semiconductor device, comprising:
    forming a first interlayer dielectric layer having a conductive contact which is to be dry-etched;
    forming a sacrifice layer over the first interlayer dielectric layer;
    selectively etching the sacrifice layer to form a trench exposing the conductive contact;
    forming a conductive interconnection by burying a conductive material, which is not dry-etched, in the trench;
    removing the sacrifice layer; and
    forming a recess by dry-etching a part of the conductive contact exposed after the removing of the sacrifice layer.

10. The method of claim 9, further comprising forming a second interlayer dielectric layer over the resultant structure, the second interlayer dielectric layer providing an air gap between the conductive interconnections, after the forming of the recess.

11. The method of claim 9, wherein the first interlayer dielectric layer comprises first and second insulating layers which are sequentially stacked, and
the second insulating layer has a different etch rate from the sacrifice layer.

12. The method of claim 9, wherein the conductive material comprises copper.

13. The method of claim 9, wherein the forming of the conductive interconnection comprises a second barrier layer along the sidewalls and bottom surface of the trench, before the conductive material is buried.

14. The method of claim 13, wherein the conductive contact comprises a first metal layer and a first barrier layer surrounding the sidewalls and bottom surface of the first metal layer, and
in the forming of the recess,
the second barrier layer on the sidewalls of the trench is removed.

15. The method of claim 11, wherein, in the forming of the recess,
the second insulating layer is removed.

16. The method of claim 10, wherein the bottom surface of the air gap is positioned under the conductive interconnection.

17. A semiconductor device comprising:
a first interlayer dielectric layer having a conductive contact; and
a conductive interconnection formed over the first interlayer dielectric layer and contacted with the conductive contact,
wherein the conductive interconnection comprises a material which is not dry-etched, and
wherein the conductive contact is formed of a material which is to be dry-etched and the conductive contact has a recess formed at a portion thereof, exposed by the conductive interconnection.

18. The semiconductor device of claim 17, further comprising a second interlayer dielectric layer covering the conductive interconnection and providing an air gap between the conductive interconnections.

19. The semiconductor device of claim 18, wherein the bottom surface of the air gap is positioned under the conductive interconnection.

20. The semiconductor device of claim 17, wherein the conductive interconnection comprises copper.

* * * * *